United States Patent
Ahn

(10) Patent No.: US 7,029,970 B2
(45) Date of Patent: Apr. 18, 2006

(54) METHOD FOR FABRICATING SEMICONDUCTOR DEVICE

(75) Inventor: Myung-Kyu Ahn, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/931,770

(22) Filed: Aug. 31, 2004

(65) Prior Publication Data

US 2005/0118779 A1 Jun. 2, 2005

(30) Foreign Application Priority Data

Nov. 28, 2003 (KR) ...................... 10-2003-0085647

(51) Int. Cl.
*H01L 21/8242* (2006.01)

(52) U.S. Cl. ...................... 438/239; 438/399; 438/238; 438/397; 438/253; 438/254; 438/255; 438/256; 438/381; 438/396; 438/398

(58) Field of Classification Search ............... 438/3, 438/240, 238, 239, 253, 254, 255, 256, 381, 438/396, 397, 398, 399
See application file for complete search history.

(56) References Cited

U.S. PATENT DOCUMENTS 5,759,914 A * 6/1998 Park .......................... 438/624
6,235,578 B1 * 5/2001 Brown ........................ 438/253
6,381,165 B1    4/2002 Lee et al.
6,800,522 B1 * 10/2004 Lee ............................. 438/253
2003/0003654 A1 * 1/2003 Brown ........................ 438/253
2003/0048593 A1 * 3/2003 Hong ......................... 361/303
2003/0215983 A1   11/2003 Bae et al.
2004/0067623 A1 * 4/2004 Chuang ...................... 438/467
2005/0095782 A1 * 5/2005 Park ........................... 438/255

* cited by examiner

*Primary Examiner*—B. William Baumeister
*Assistant Examiner*—Victor V. Yevsikov
(74) *Attorney, Agent, or Firm*—Blakely Sokoloff Taylor & Zafman

(57) ABSTRACT

A method for fabricating a semiconductor device capable of preventing an electric short between lower electrodes caused by leaning lower electrodes, or lifted lower electrodes and of securing a sufficient capacitance of a capacitor by increasing an effective capacitor area. The method includes the steps of: preparing a semi-finished semiconductor substrate; forming a sacrificial layer on the semi-finished semiconductor substrate; patterning the sacrificial layer by using an island-type photoresist pattern, thereby obtaining at least one contact hole to expose portions of the semi-finished semiconductor substrate; and forming a conductive layer on the sacrificial layer.

13 Claims, 20 Drawing Sheets

… … …

METHOD FOR FABRICATING SEMICONDUCTOR DEVICE

FIELD OF THE INVENTION

The present invention relates to a method for fabricating a semiconductor device; and, more particularly, to a method for fabricating a lower electrode of a capacitor in a semiconductor device.

DESCRIPTION OF RELATED ARTS

A recent progression in micronization in semiconductor technology has led to acceleration in achieving a large-scale of integration of a memory device. As a result, a unit cell area is decreased and a required operation voltage becomes low. Although the unit cell area is decreased, it is required to have a capacitance greater than 25 fF per cell in order to prevent incidences of soft error and shortened refresh time. Therefore, there have been diverse approaches to secure a required capacitance.

One approach for securing a required capacitance is to form a capacitor in three dimensions. Typical examples of three-dimensional capacitor are a concave-type capacitor and a cylinder-type capacitor.

FIGS. 1A to 1D are cross-sectional views illustrating a conventional method for forming lower electrodes in a semiconductor device.

Referring to FIG. 1A, a first inter-layer insulation layer 11 is formed on a substrate 10 provided with various device elements such as transistors. A first plug 12 contacted to a portion of the substrate 10 is formed by passing through the first inter-layer insulation layer 11. More specifically, the first plug 12 is formed in a manner to be electrically connected to a predetermined portion of the substrate 10. Herein, although not illustrated, the predetermined portion of the substrate 10 is an impurity junction region such as a source/drain.

Also, the first inter-layer insulation layer 11 is made of an oxide-based material. Tetraethylorthosilicate (TEOS) is commonly used for forming the first inter-layer insulation layer 11. The first plug 12 is formed by using polysilicon. Although not illustrated, a barrier layer of Ti/TiSi$_2$/TiN is formed on the first plug 12 for the purpose of forming an ohmic contact and preventing a material for forming a lower electrode from being diffused into the substrate 10.

Next, a chemical mechanical polishing (CMP) process is performed to planarize the first plug 12 and the first inter-layer insulation layer 11. Afterwards, a second inter-layer insulation layer 13 is formed thereon. A plurality of bit lines 14 are formed on predetermined regions of the second inter-layer insulation layer 13 which are not being overlapped with a region where the first plug 12 is formed. A first etch stop layer 15 is formed on the above resulting substrate structure. Herein, the first etch stop layer 15 is made of a nitride-based material.

The first etch stop layer 15 plays a role in preventing losses of the bit lines 14 during an etching process for forming a storage node contact of a capacitor. Particularly, the first etch stop layer 15 is made of a nitride-based material such as silicon nitride or silicon oxynitride in order to have a different etch selectivity from a third inter-layer insulation layer 16 made of an oxide-based material.

The aforementioned third insulation layer 16 is formed on the first etch stop layer 15 and is then subjected to an etch-back process or a CMP process. After the planarization of the third inter-layer insulation layer 16, a first photoresist pattern 17 for forming a storage node contact is formed on the planarized third inter-layer insulation layer 16.

Referring to FIG. 1B, the planarized third inter-layer insulation layer 16, the first etch stop layer 15 and the second insulation layer 13 are sequentially etched with use of the first photoresist pattern 17 as an etch mask to form a contact hole 100 for forming a capacitor. Herein, the contact hole 100 exposes the first plug 12. After the formation of the contact hole 100, the first photoresist pattern 17 is removed.

At this time, the etching of the third inter-layer insulation layer 16 stops firstly at the first etch stop layer 15, and the first etch stop layer 15 and the second inter layer insulation layer 13 are etched thereafter. Through this change in an etch recipe for each step of the above etching process, it is possible to obtain an intended etch profile.

Referring to FIG. 1C, a conductive material such as polysilicon is formed on the planarized third inter-layer insulation layer 16 and the contact hole 100. Then, a CMP process is performed until a surface of the planarized third inter-layer insulation layer 16 is exposed, thereby obtaining a second plug 18 electrically connected to the first plug 12. Herein, the second plug 18 is a contact plug for a capacitor.

Next, a second etch stop layer 19 made of a nitride-based material is formed to prevent the second plug 18 from being damaged during an etching process for forming a lower electrode of a capacitor. Thereafter, a sacrificial insulation layer 20 used for forming a capacitor is formed on the second etch stop layer 19 with a predetermined thickness in consideration of a height of the capacitor, which is a factor for affecting a capacitance of the capacitor. Herein, the sacrificial insulation layer 20 is made of an oxide-based material. A second photoresist pattern 21 for forming a lower electrode is then formed on the sacrificial insulation layer 20. It is also possible to omit the formation of the second etch stop layer 19 since it is relatively easy to control the etching process for forming the lower electrode.

Referring to FIG. 1D, the sacrificial insulation layer 20 is etched by using the second photoresist pattern 21 as an etch mask. This etching stops at the second etch stop layer 19, and then, a portion of the second etch stop layer 19 is removed to form an opening exposing the second plug 18.

Afterwards, the second photoresist pattern 21 is removed. Then, a lower electrode 22 is formed. Although not illustrated, the lower electrode is prepared by performing a series of processes. First, a conductive material for forming the lower electrode is formed along a profile including the opening so to be contacted to the second plug 18. A photoresist layer is formed such that the photoresist layer is filled into a concave space created after the formation of the conductive material. A blanket-etch process or a CMP process is performed until a surface of the sacrificial insulation layer 20 is exposed.

The sacrificial insulation layer 20 is removed through a wet dip-out process with use of a chemical solution such as buffered oxide etchant (BOE) or hydrofluoric acid (HF), thereby forming the above mentioned lower electrode 22 in a cylinder structure. Thereafter, the photoresist layer is removed through the use of a dry stripping process using a mixed gas of $O_2$, $CF_4$, $H_2O$ and $N_2$ or a mixed gas of $O_2$ and $N_2$. After the dry stripping process, a cleaning process using a solvent proceeds to remove etch remnants and the remaining photoresist layer.

Subsequently, a thermal process is performed to recover deteriorated characteristics of the lower electrode 22 caused by the above wet dip-out process. Prior to formation of a dielectric layer, a cleaning process is carried out with use of a chemical such as BOE for a short period to additionally remove impurities.

Although not illustrated, the dielectric layer and an upper electrode are formed on the lower electrode 22.

FIG. 2 is a top view showing a plurality of conventional lower electrodes. Herein, the same reference numerals are used for the same constitution elements shown in FIGS. 1A to 1D.

As shown, a plurality of bit lines 14 are arranged in one direction, and a plurality of second plugs 18 disposed between the bit lines 14 are arranged in the form of matrix. There are a plurality of lower electrodes 22 being overlapped with the plurality of corresponding second plugs 18 and contacting the second plugs 18.

The sacrificial insulation layer 20 is etched with use of a mask pattern, which has a square shape but provides an elliptical etch profile because of a characteristic of an adopted etch process, so that the lower electrode 22 is formed in a concave structure or a cylinder structure. In this case, however, there may be a problem of an electric short between the lower electrodes 22 because of leaning lower electrodes 22 resulted from an interfacial tension created by the use of BOE or HF in the wet dip-out process.

FIG. 3 is a cross-sectional view showing an electric short occurring between lower electrodes because of leaning lower electrodes. Herein, the electric short is denoted with a reference numeral 23. As a distance between the lower electrodes 22 and the size of the lower electrode 22 are decreased and the height of the lower electrode 22 is increased, the electric short 23 between the lower electrodes 22 becomes more severe.

One attempt to overcome this problem of electric short between the lower electrodes is to reduce an area of a region shared by a pair of lower electrodes of cylindrical capacitors thorough a specific arrangement of the lower electrodes. That is, unlike the above described conventional matrix-like arrangement of the lower electrodes, a pair of first lower electrodes and the other pair of second lower electrodes are arranged in the form of zigzags by disposing the pair of the first lower electrodes in opposite to the other pair of second lower electrodes with respect to a bit line formed between these two pairs.

FIG. 4 is a top view showing a conventional semiconductor device with a plurality of lower electrodes.

As shown, a plurality of bit lines 40 are formed in a direction of an X axis. There are a plurality of imaginary lines of the X axis X1 and X2 practically pointing to the same direction of the X axis and a plurality of imaginary lines of an Y axis Y1 and Y2 practically pointing to the same direction of the Y axis. Herein, the X1 and X2 denotes a first imaginary line of the X axis and a second imaginary line of the X axis, respectively. Also, the Y1 and Y2 denote a first imaginary line of the Y axis and a second imaginary line of the Y axis, respectively.

The first and the second imaginary lines of the X axis X1 and X2 and the first and the second imaginary lines of the Y axis Y1 and Y2 make a plurality of crisscross points O in the form of a matrix or lattice. Also, a plurality of plugs 41 which will be connected with capacitors are arranged in the form of matrix. Particularly, a central point of each plug 41 is positioned at the respective criscross point O.

In more detail, the plurality of plugs 41 are respectively connected with a plurality of other plugs (not shown) being contacted to active regions of a substrate. In the first and the second imaginary lines of the Y axis Y1 and Y2, the plurality of plugs 41 are arranged with a first predetermined distance D1 corresponding to a width of the bit line 40. In the first and the second imaginary lines of the X axis X1 and X2, the plurality of plugs 41 are arranged with a second predetermined distance D2. Herein, an actual distance between each two of the plugs 41 is smaller than the first and the second predetermined distances D1 and D2 because of a landing plug contact structure in which a bottom portion of a contact is minimized to meet demands of large-scale integration and a top portion of the contact has a larger area than the bottom portion.

Also, on top of the plugs 41, a plurality of lower electrodes 42A1 to 42B2 are arranged with a third predetermined distance D3 to make electric contacts with the corresponding plugs 41. Herein, the reference numerals 42A1, 42A2 denote a left first lower electrode and a right first lower electrode, respectively, and the reference numerals 42B1 and 42B2 denote a left second lower electrode and a right second lower electrode, respectively. In any imaginary line of the Y axis, for instance, in the first imaginary line of the Y axis Y1 that passes a central point of each plug 41, a pair of the left first lower electrode 42A1 and the left second lower electrode 42B1 are arranged in a specific manner to face each other towards the first imaginary line of the Y axis Y1 with a minimum area. That is, without a change in the first and the second imaginary lines of the X axis X1 and X2 that pass respective central points O1" and O1' of the left first lower electrode 42A1 and the left second lower electrode 42B1, the central point O1" of the left first lower electrode 42A1 and the central point O1' of the left second lower electrode 42B1 are arranged at a different point of the first and the second imaginary lines of the X axis X1 and X2, respectively.

As shown in FIG. 4, each plug 41 disposed beneath the pair of the left first lower electrode 42A1 and the left first lower electrode 42B1 has the central point O1 positioned at the same first imaginary line of the Y axis Y1. However, the central point O1' of the left second lower electrode 42B1 and the central point O1" of the left first lower electrodes 42A1 are positioned at different imaginary lines of the Y axis, i.e., a first shifted imaginary line Y1' and a second shifted imaginary line Y1", respectively. This different allocation of the central points O1' and O1" indicates that the pair of the left first lower electrodes 42A1 and the left second lower electrode 42B1 are arranged in the form of zigzags.

Because of this zigzag arrangement, the pair of the left first lower electrode 42A1 and the left second lower electrode 42B1 faces each other with a minimum area. Therefore, it is possible to reduce an interfacial tension created by a chemical solution used in a wet dip-out process for removing a sacrificial insulation layer. As a result of this effect, it is further possible to solve the problem of the electric short between the neighboring lower electrodes caused by the leaning lower electrodes.

One suggested method to solve a problem of bridge formation between the lower electrodes is to arrange the above plugs for forming capacitors not in the form of matrix but in the form of zigzag.

However, it is required to change a layout of bit lines and word lines in order to arrange the plugs for forming capacitors in the form of zigzag. Thus, an additional cost is necessary. As a result, in consideration of practicability of this suggested method, it is rather attempted to arrange the lower electrodes in the form of zigzag.

Nevertheless, this attempt to arrange the lower electrodes in the form of a zigzag has disadvantages. First, as a pattern becomes micronized, it is difficult to prevent the pattern from collapsing. Also, another factor that may cause the pattern to collapse is that the lower electrodes become lifted, further resulting in an electric short between the lower electrodes.

Second, because the lower electrodes have an elliptical shape, the sacrificial insulation layer is etched with a different etch characteristic depending on a major axis and a minor axis of the elliptical lower electrodes. Thus, in the major axis, an inclined etch profile is obtained, resulting in a decrease in an effective surface area of a capacitor.

Also, because of the inclined etch profile, a bottom portion of the resulting etch profile has a smaller critical dimension than a top portion of the resulting etch profile dose. As a result, when metastable polysilicon (MPS) grains are grown for the purpose of increasing a capacitance of the capacitor, it is difficult to completely form MPS grains, a dielectric layer and an upper electrode because of an electric short between the MPS grains at a bottom part of the lower electrode.

FIGS. 5A and 5B are cross-sectional views schematically showing only the lower electrode in a direction of the second shifted first imaginary line of the Y axis Y1" and in a direction of the first imaginary line of the X axis X1 shown in FIG. 4. More specifically, FIG. 5A is a cross-sectional view of the left first lower electrode 42A1 taken along a major axis of the left first lower electrode 42A having the shape of ellipse. FIG. 5B is a cross-sectional view of the left first lower electrode 42A1 taken along a minor axis of the left first lower electrode 42A having the shape of ellipse.

As described above, the left first lower electrodes 42A1 of the cylindrical capacitor are formed in the shape of ellipse. Because of a characteristic of an etching process proceeding on the focus of the minor axis, an aspect ratio between the major axis and the minor axis is pronounced. Since the etch characteristic is sensitive to an aspect ratio, the etch profile of the major axis is different from that of the minor axis. Therefore, the minor axis has a vertical etch profile as shown in FIG. 5B, while the major axis has an inclined etch profile as shown in FIG. 5A. Reference numerals 44 and 45 represents the inclined etch profile and the vertical etch profile, respectively. Particularly, compared with the vertical etch profile, the inclined etch profile becomes a factor for decreasing an effective capacitance of the capacitor.

If an over-etching process is adopted to obtain a vertical etch profile of the major axis, a sacrificial insulation layer in the minor axis is excessively etched, resulting in a bowing profile, which causes the electric short between the lower electrodes as shown in FIG. 3.

The inclined etch profile of the major axis makes a contact area of the lower electrode smaller compared with an intended contact area of the lower electrode. As a result of this decreased contact area, there is a high chance that the lower electrode will lift during the wet dip-out process or other subsequent process. Because of the decreased critical dimension, a thickness of the lower electrode is also decreased, further increasing a chance of a broken lower electrode.

As the size of a device has become smaller, a thickness of an etch target increases in order to secure a certain level of a capacitance. This increase in the thickness of the etch target results in an increase in an aspect ratio, which, in turn, causes a difference between the etch profile of the major axis and that of the minor axis to be pronounced in more extents. Eventually, this decrease in the effective capacitor area may result in a difficulty in securing the capacitance. Also, it may be highly probable that the electric short between the lower electrodes occurs more frequently because of the bridge formed between the lower electrodes.

To solve the above described problems, there have been made other attempts to achieve effects of increasing the capacitance and simultaneously preventing the bridge formation between the lower electrodes caused by the leaning lower electrodes resulted from a difference between the etch profiles of the major axis and the minor axis. More specifically, the lower electrodes are arranged in the form of zigzag to decrease an area of a region shared by the pair of the lower electrodes and thus to prevent an incidence of the electric short between the lower electrodes caused by an interfacial tension from the wet dip-out process. Simultaneously, the shape of the lower electrode is changed from an ellipse to a circle. As a result of this specific zigzag arrangement and the change in shape, it is possible to prevent the bridge formation between the lower electrodes caused by the above described leaning phenomenon and to increase the capacitance.

FIG. 6 is a top view showing a conventional semiconductor device with lower electrodes.

As shown, a plurality of bit lines 60 are arranged in a direction of an X axis. There are a plurality of imaginary lines of the X axis X1 and X2 practically pointing to the same direction of the X axis and a plurality of imaginary lines of an Y axis Y1 and Y2 practically pointing to the same direction of the Y axis. Herein, the X1 and X2 denotes a first imaginary line of the X axis and a second imaginary line of the X axis, respectively. Also, the Y1 and Y2 denote a first imaginary line of the Y axis and a second imaginary line of the Y axis, respectively.

The first and the second imaginary lines of the X axis X1 and X2 and the first and the second imaginary lines of the Y axis Y1 and Y2 make a plurality of criscross points O in the form of matrix or lattice. Also, a plurality of plugs 61 which will be connected with capacitors are arranged in the form of matrix. Particularly, a central point of each plug is positioned at the respective criscross point O.

In more detail, the plurality of plugs 61 are respectively connected with a plurality of other plugs (not shown) being contacted to active regions of a substrate (not shown). In the first and the second imaginary lines of the Y axis Y1 and Y2, the plurality of plugs 61 are arranged with a first predetermined distance D1 corresponding to a width of the bit lien 60. In the first and the second imaginary lines of the X axis X1 and X2, the plurality of plugs 61 are arranged with a second predetermined distance D2. Herein, an actual distance between each two of the plugs 61 is smaller than the first and the second predetermined distances D1 and D2 because of a landing plug contact structure in which a bottom portion of a contact is minimized to meet a demand of large-scale of integration and a top portion of the contact has a larger area than the bottom portion does.

Also, on top of the plugs 61, a plurality of lower electrodes 62A1 to 62B2 are arranged with a third predetermined distance D3 to make electric contacts with the corresponding plugs 61. Herein, the reference numerals 62A1 and 62A2 denote a left first lower electrode and a left second lower electrode, respectively, and the reference numerals 62B1 and 62B2 denote a right first lower electrode and a right second lower electrode, respectively. In any imaginary line of the Y axis, for instance, in the first imaginary line of the Y axis Y1 that passes a central point of each plug 61, a pair of the left first lower electrode 62A1 and the left second lower electrode 62B1 are arranged specifically to face each other towards the first imaginary line of the Y axis Y1 with a minimum area. That is, without a change in the first and the second imaginary lines of the X axis X1 and X2 that pass respective central points O1" and O1' of the left first lower electrode 62A1 and the left second lower electrode 62B1, the central point O1" of the left first lower electrode 62A1 and the central point O1' of the left second lower electrode 62B1 are arranged at a different point of the first and the second imaginary lines of the X axis X1 and X2, respectively.

As shown in FIG. 6, each plug 61 disposed beneath the pair of the left first lower electrode 62A1 and the left second lower electrode 62B1 has the central point O1 positioned at the same first imaginary line of the Y axis Y1. However, the central point O1' of the left second lower electrode 62B1 and the central point O1" of the left first lower electrodes 62A1 are positioned at different imaginary lines of the Y axis, i.e., a first shifted imaginary line Y1' and a second shifted imaginary line Y1", respectively. This different allocation of the central points O1' and O1" indicates that the pair of the left first lower electrodes 62A1 and the left second lower electrode 62B1 are arranged in the form of zigzags.

Because of this zigzag arrangement, the pair of the left first lower electrode 62A1 and the left second lower electrode 62B1 faces each other with a minimum area. Therefore, it is possible to reduce an interfacial tension created by a chemical solution used in a wet dip-out process for removing a sacrificial insulation layer. As a result of this effect, it is further possible to solve the problem of the electric short between the neighboring lower electrodes occurring when the lower electrodes become lifted.

As mentioned above, the lower electrodes 62A1 to 62B2 are arranged with the second predetermined distance D2, which is a distance between the plugs 61, and thus, there is not a region shared by each pair of the lower electrodes 62A1 to 62B2. Hence, the size of the lower electrode 62A1, 62A2, 62B1 or 62B2 can be increased, thereby providing an additional effect of increasing the capacitance.

FIGS. 7A to 7C are micrographs of scanning electron microscopy (SEM) showing that lower electrodes formed based on the above described conventional methods become leaned after a wet dip-out process.

More specifically, FIG. 7A shows that elliptical lower electrodes 70A arranged in the form of matrix are collapsed. A reference denotation X expresses this pattern collapse phenomenon. FIG. 7B shows elliptical lower electrodes 70B arranged in the form of zigzag. As shown, the lower electrodes 70B become leaned less frequently than the elliptical lower electrodes 70A shown in FIG. 7A do. However, the pattern collapse phenomenon expressed with a reference denotation Y still occurs due to a limitation in process resulted from large scale integration and a bowing profile caused by a difference between etch profiles of a major axis and a minor axis. FIG. 7C shows that the pattern collapse phenomenon is not observed when circular lower electrodes 70C are arranged in the form of zigzag. However, the lower electrodes may become leaned as the design rule is minimized and the height of the lower electrode is increased.

FIGS. 8A to 8D are cross-sectional views illustrating a conventional method for forming circular lower electrodes arranged in the form of zigzag.

FIG. 8A shows a cross-sectional view of a substrate structure prepared for forming lower electrodes. As shown, a plurality of storage node contact plugs 80 are formed in predetermined portions of an inter-layer insulation layer 81. An etch stop layer 82 made of a nitride-based material, a sacrificial insulation layer 83 made of an oxide-based material and a hole-type photoresist pattern are sequentially formed on the above resulting substrate structure.

FIG. 8B shows a cross-sectional view of a substrate structure obtained by performing an etching process to the sacrificial insulation layer shown in FIG. 8A. As shown, the sacrificial insulation layer 83 is etched by using the photoresist pattern 84 (refer to FIG. 8A) as an etch mask, thereby providing a patterned sacrificial insulation layer 83A. Afterwards, the photoresist pattern 84 is removed.

FIG. 8C shows a cross-sectional view of a substrate structure obtained by performing an additional etching process to the substrate structure shown in FIG. 8B. As shown, the etch stop layer 82 is selectively etched to expose the storage node contact plugs 80.

FIG. 8D shows a cross-sectional view of lower electrodes formed on the substrate structure shown in FIG. 8C. Although not illustrated, a semi-finished substrate structure for forming the lower electrodes 85 is prepared first by forming a material for forming lower electrodes 85 on the patterned sacrificial insulation layer 83A shown in FIG. 8C. Then, a chemical mechanical polishing (CMP) process or an etch-back process is performed to achieve isolation of the lower electrodes 85. The patterned sacrificial insulation layer 83A is removed through a wet etching process. Herein, the lower electrodes 85 have a cylinder structure.

When the sacrificial insulation layer 83 is patterned through performing a plasma etching process, plasma particles are deposited on certain regions because of the use of the hole-type photoresist pattern 84. Thus, this concentrated deposition of the plasma particles on certain regions results in an etch profile having the shape of an elongated pot. This characteristic etch profile of the lower electrode 85 is denoted with a reference numeral 86.

FIG. 9 is a top view of a conventional hole-type photoresist pattern used for forming a lower electrode. Herein, the same reference numerals are used for the same constitution elements shown in FIGS. 8A to 8D.

As shown, an exposed portion of a sacrificial insulation layer 83 is formed in hole-type, while a photoresist pattern 84 is connected into one. Thus, portions of the sacrificial insulation layer 83 disposed on top of storage node contact plugs 80 are removed.

FIGS. 10A to 10C are mimetic diagrams for describing a leaning phenomenon of lower electrodes having a cylinder structure.

Particularly, FIG. 10A is a cross-sectional view showing lower electrodes 85 having a cylinder structure. Herein, reference denotations 'Fe', 'Fs', 'θ', and 'H' express a shear and bending force of the lower electrode 85, a surface tension between the two lower electrodes 85, an angle of a contact between the lower electrode 85 and a substrate 86, and a height of the lower electrode 85, respectively.

FIG. 10B is a top view of lower electrodes 85 having a cylinder structure. Herein, reference denotations 'D', 'LL', 'LLin', 'LS', and 'LSin' express a distance between the lower electrodes 85, a length of an outer longer axis of the lower electrode 85, a length of an inner longer axis of the lower electrode 85, a length of an outer shorter axis of the lower electrode 85, and a length of an inner shorter axis of the lower electrode 85, respectively.

FIG. 10C is a top view of bridges formed between lower electrodes 85. Herein, the lower electrodes 85 has a cylinder structure.

Herein, a reference denotation 'δx' expresses a distance of a deformed lower electrode 85 from a reference point. The deformation distance δx can be calculated based on a relationship between the shear and bending force 'Fe' and the surface tension 'Fs', more specifically, a state where the shear and bending force 'Fe' and the surface tension 'Fs' become equal. The shear and bending force Fe is defined as follows.

$$Fe = 3EI\delta x/H3 \quad \text{Equation 1}$$

Herein, the shear and bending force 'Fe' and the deformation distance 'δx' are a unit of force in Newtons (N) and a unit of length in meters (m). Also, 'E' represents the Young's modulus expressed in a unit of 'N/m', and 'I' represents an inertial moment of a horizontal cross-section expressed in a unit of m⁴.

In addition, the surface tension 'Fs' can be expressed as the following mathematical equation.

$$Fs = 2\gamma \sin \theta (L+H) \quad \text{Equation 2}$$

Herein, the surface tension 'Fs' represents a unit of force in Newtons, and 'γ' represents a surface tension coefficient of water in a unit of 'N/m'.

On the basis of a relationship that the shear and bending force 'Fe' equals the surface tension 'Fs', it is possible to obtain the deformation distance 'δx' with use of the two given equations 1 and 2. The deformation distance 'δx' is then defined as follows.

$$\delta x = 2\gamma \sin \theta (L+H) H3/3EI \quad \text{Equation 3}$$

With reference to the equation 3, a bridge is formed between lower electrodes caused by the aforementioned leaning phenomenon observed when a distance in which the lower electrode is deformed to balance the surface tension 'Fs' and the shear and bending force 'Fe', i.e., the deformation distance 'δx', is greater than approximately ½ of a distance between the lower electrodes.

As shown in the equation 3, the deformation distance 'δx' can be minimum when structural stability of the lower electrode is reinforced, or when the surface tension 'Fs' of a solution used for removing the sacrificial insulation layer is decreased. However, this suggested condition may not fundamentally prevent the bridge formation between the lower electrodes caused by the leaning phenomenon.

Therefore, it is necessary to develop a method for providing an effect of securing a sufficient capacitance of a cylindrical capacitor regardless of an increase in scale of integration and for preventing an electric short between the lower electrodes caused by a bridge formed between the lower electrodes.

SUMMARY OF THE INVENTION

It is, therefore, an object of the present invention to provide a method for fabricating a semiconductor device capable of preventing an electric short between lower electrodes caused by leaning lower electrodes, or lifted lower electrodes and of securing a sufficient capacitance of a capacitor by increasing an effective capacitor area.

In accordance with an aspect of the present invention, there is provided a method for fabricating a semiconductor device, including the steps of: preparing a semi-finished semiconductor substrate; forming a sacrificial layer on the semi-finished semiconductor substrate; patterning the sacrificial layer by using an island-type photoresist pattern, thereby obtaining at least one contact hole to expose portions of the semi-finished semiconductor substrate; and forming a conductive layer on the sacrificial layer.

In accordance with another aspect of the present invention, there is provided a method for fabricating a semiconductor device, including the steps of: forming a plurality of plugs electrically connected to a substrate by passing through an inter-layer insulation layer; forming a conductive etch stop layer on the inter-layer insulation layer and the plugs; forming a sacrificial insulation layer on the etch stop layer; forming an island-type photoresist pattern on the sacrificial insulation layer; etching the sacrificial insulation layer with use of the photoresist pattern as an etch mask to expose predetermined portions of the etch stop layer; removing the exposed portions of the etch stop layer; removing the photoresist pattern; forming a conductive layer on the sacrificial insulation layer and a remaining portion of the etch stop layer; planarizing the conductive layer until the sacrificial insulation layer is exposed; removing the sacrificial insulation layer; and forming lower electrodes by removing the conductive layer disposed on the inter-layer insulation layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device in accordance with a preferred embodiment of the present invention will be described in detail with reference to the accompanying drawings.

Figure 1A:
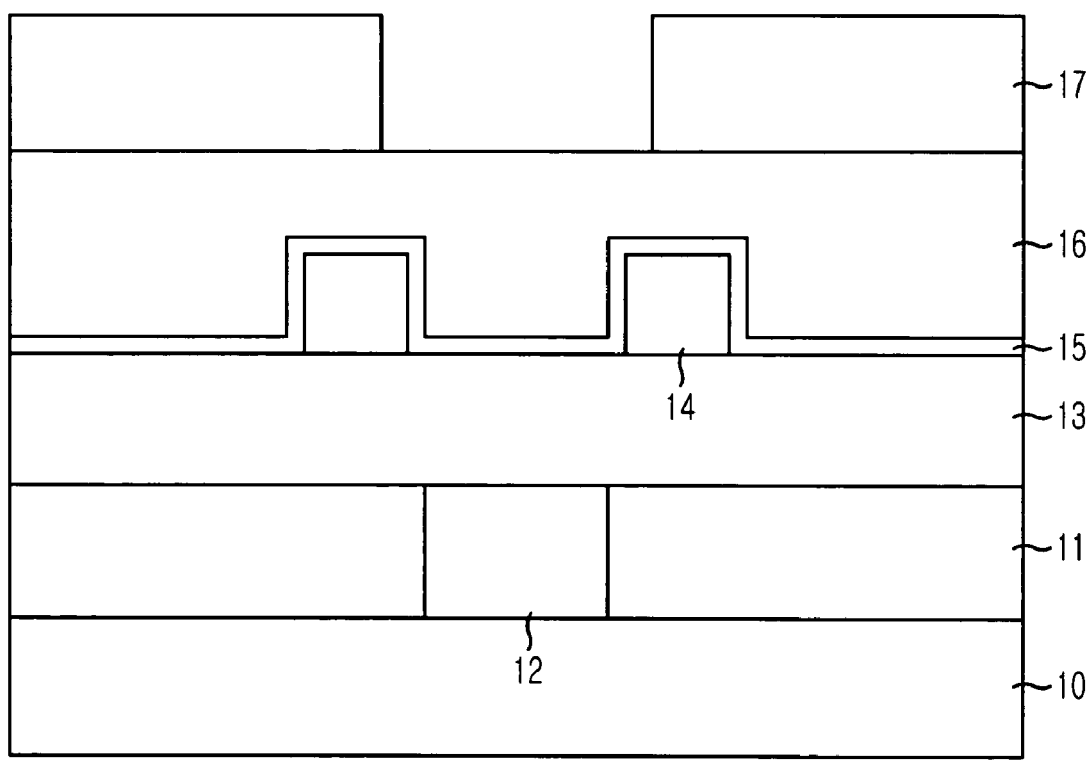
FIGS. 1A to 1D are cross-sectional views illustrating a conventional method for forming lower electrodes in a semiconductor device.
Figure 1B:
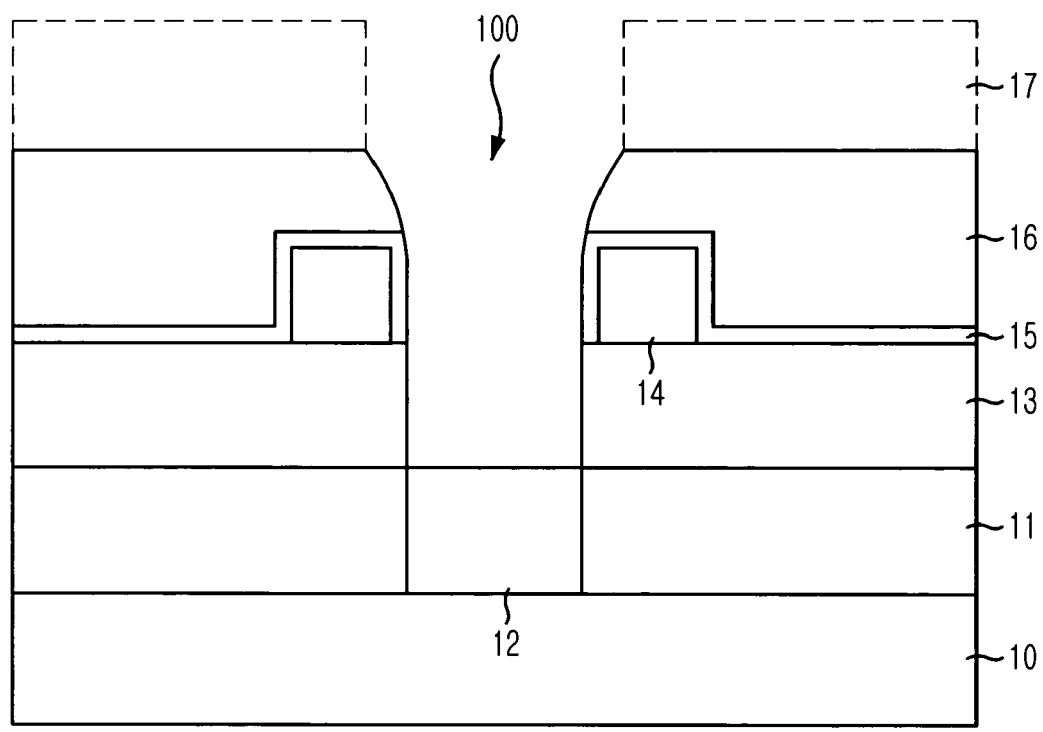
Figure 1C:
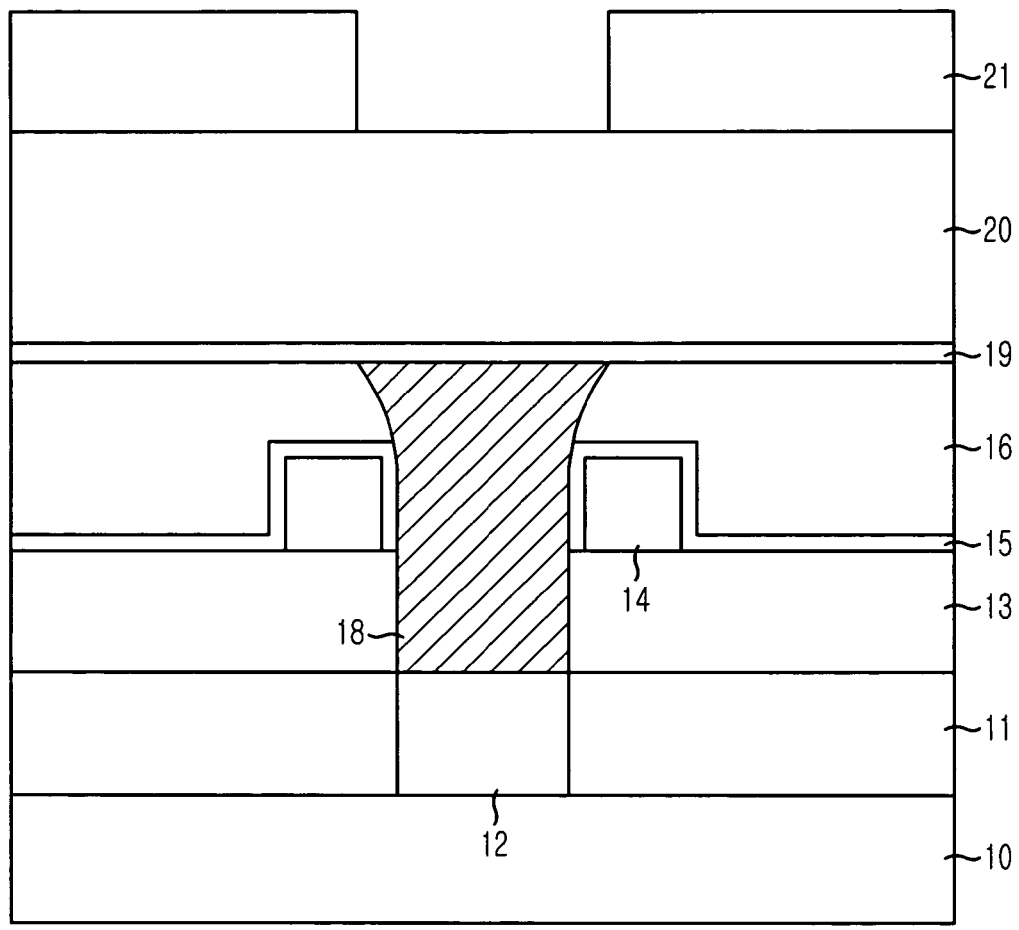
Figure 1D:
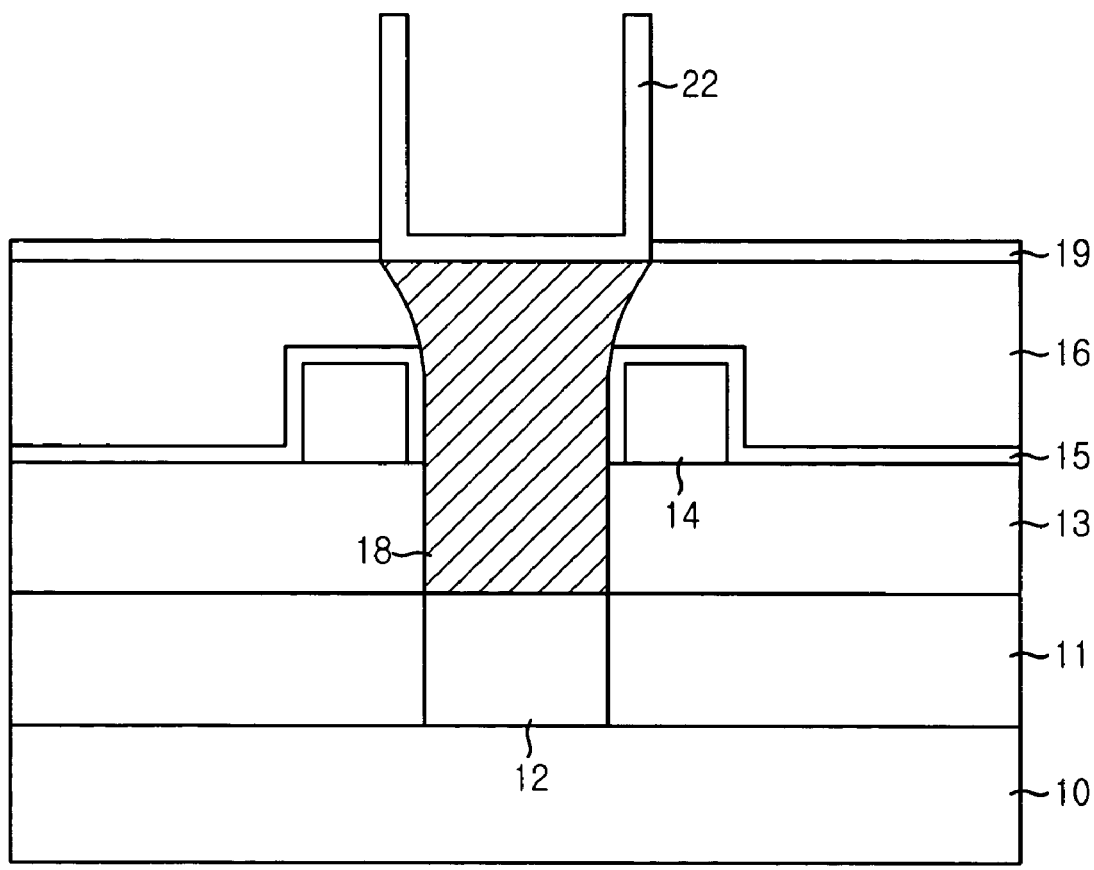
Figure 2:
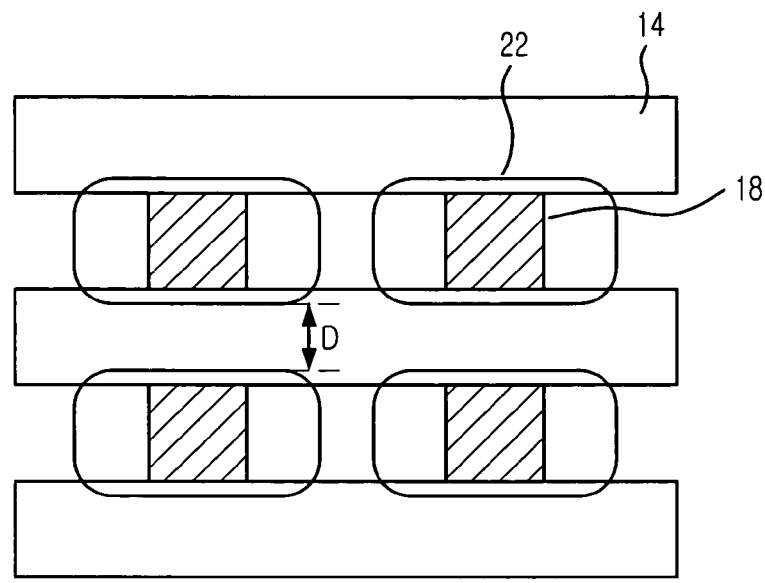
FIG. 2 is a top view showing a conventional semiconductor device including a plurality of elliptical lower electrodes.
Figure 3:
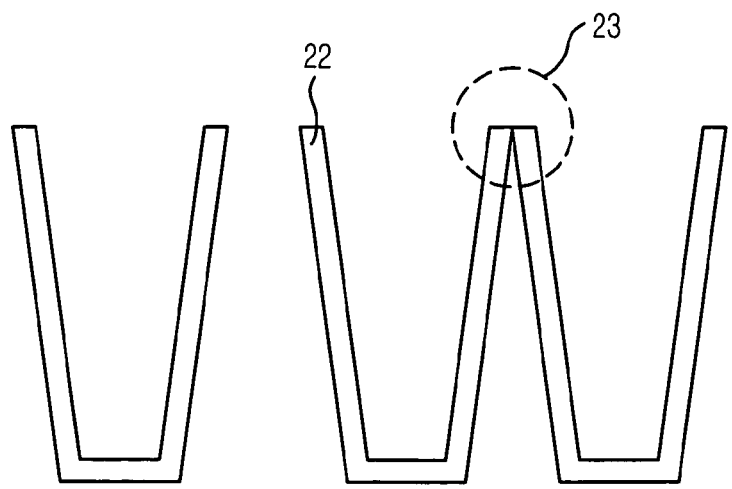
FIG. 3 is a cross-sectional view showing an electric short occurring between lower electrodes because of leaning lower electrodes.
Figure 4:
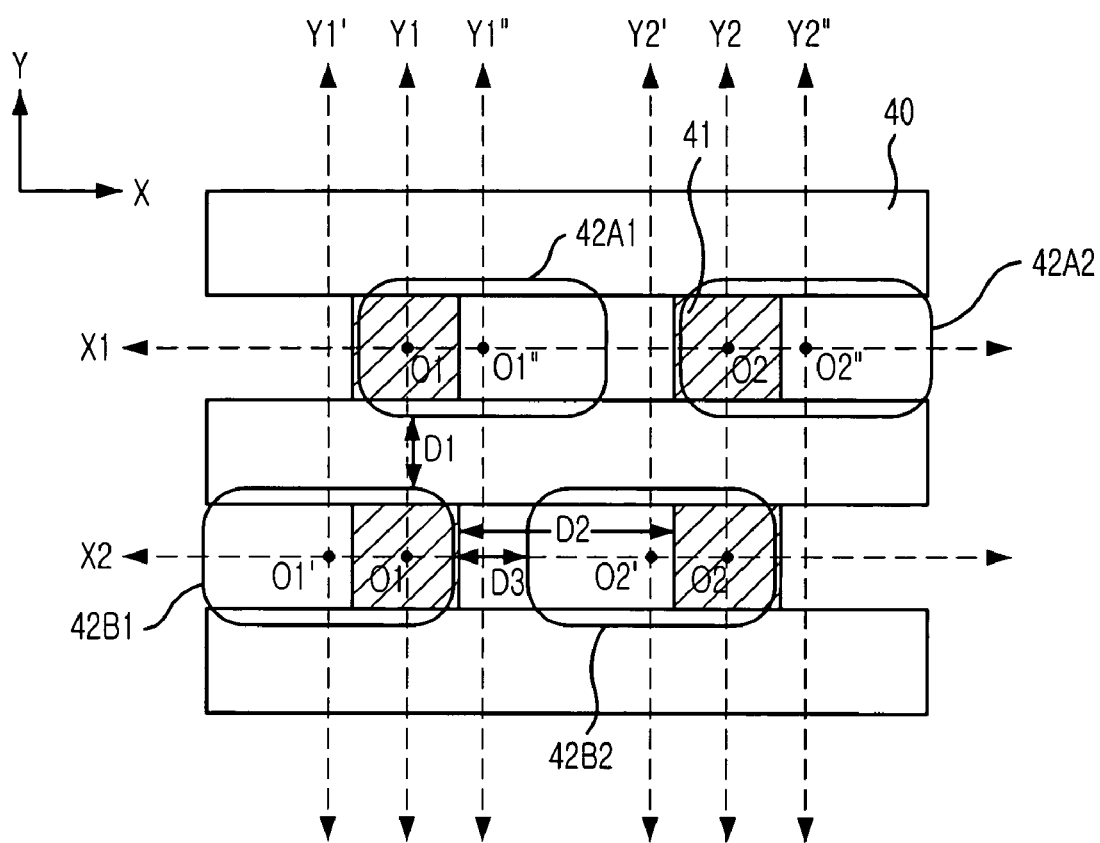
FIG. 4 is a top view showing another conventional semiconductor device including a plurality of elliptical lower electrodes.
Figure 5A:
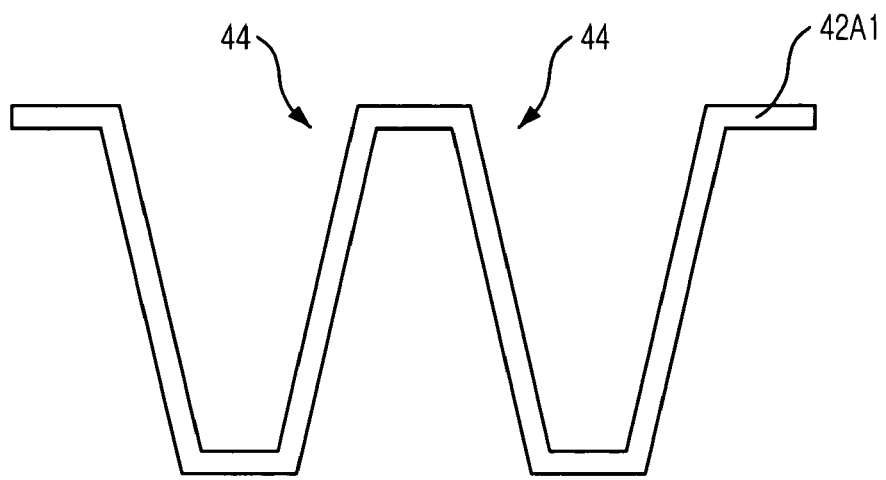
FIG. 5A is a cross-sectional view of a lower electrode taken along an imaginary line of an X axis and an imaginary line of a Y axis of FIG. 4.
Figure 5B:
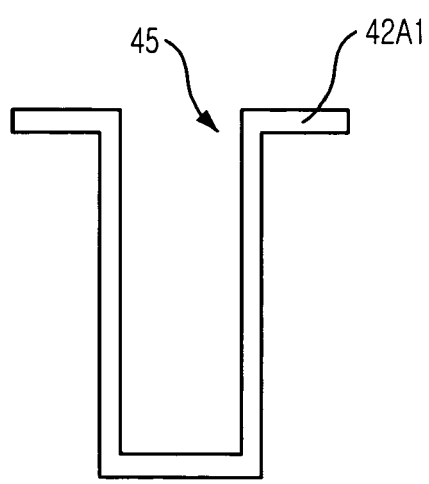
FIG. 5B is a cross-sectional view of a lower electrode taken along an imaginary line of an X axis and an imaginary line of a Y axis of FIG. 4.
Figure 6:
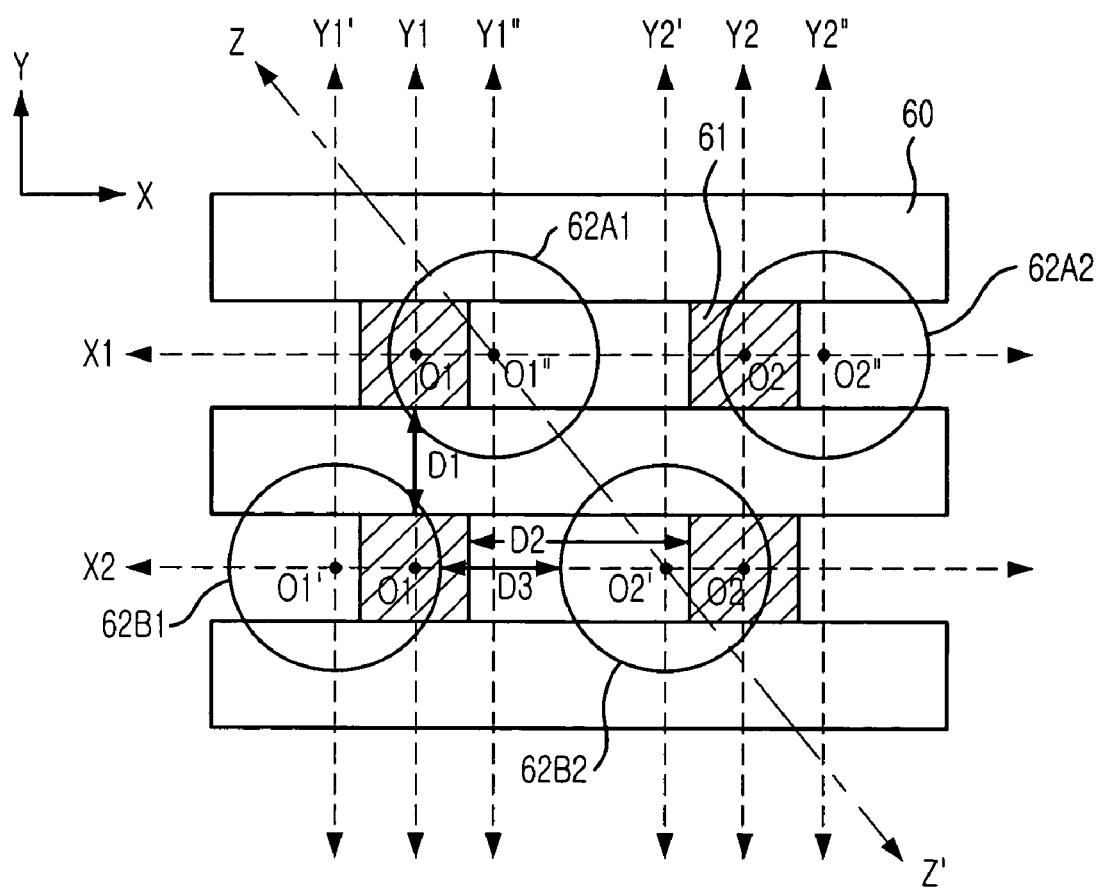
FIG. 6 is a top view showing another conventional semiconductor device including a plurality of circular lower electrodes.
Figure 7A:
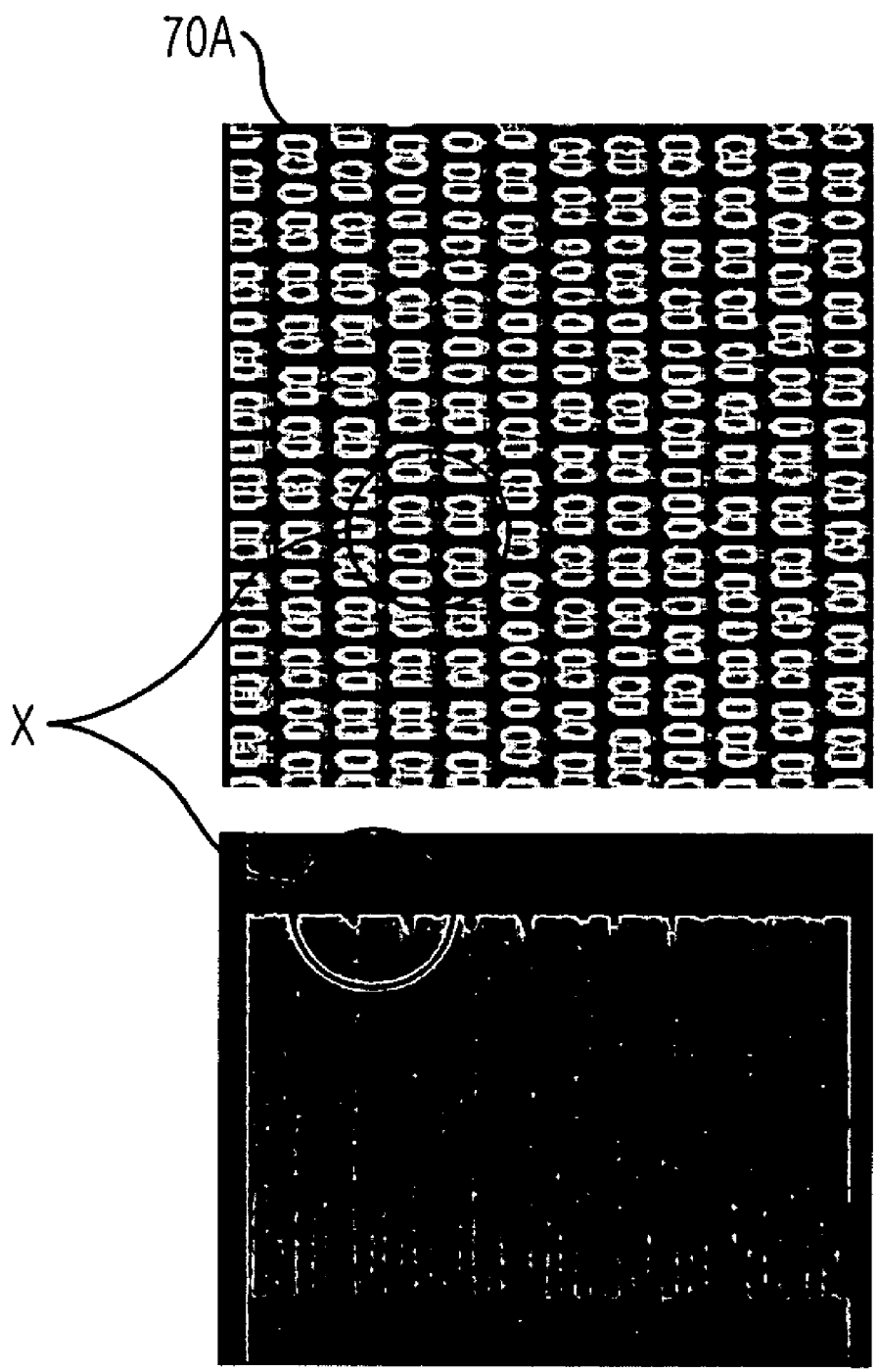
FIG. 7A shows a top view and a cross-sectional view of conventional elliptical lower electrodes arranged in the form of a matrix.
Figure 7B:
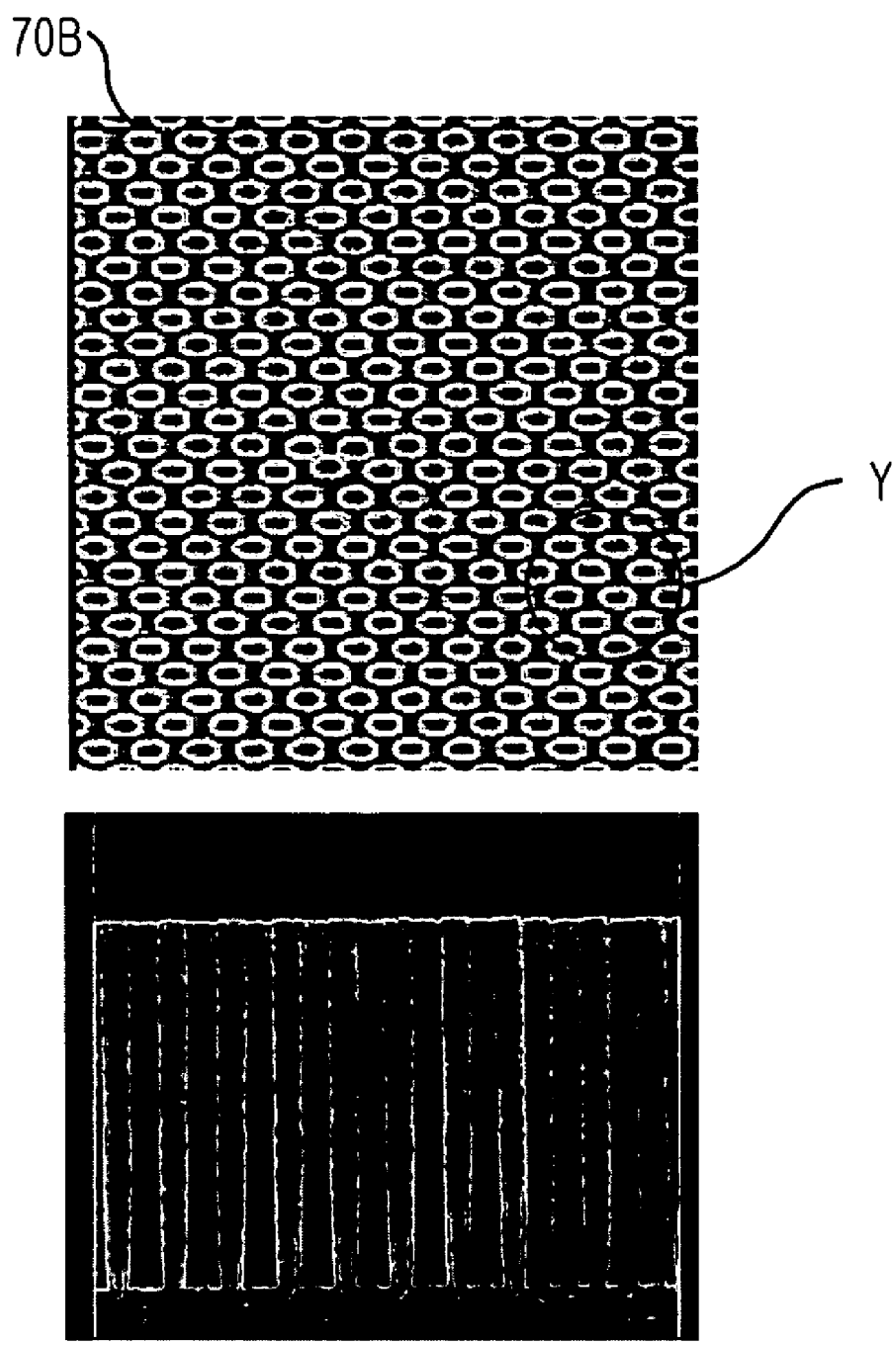
FIG. 7B shows a top view and a cross-sectional view of conventional elliptical lower electrodes arranged in the form of zigzag.
Figure 7C:
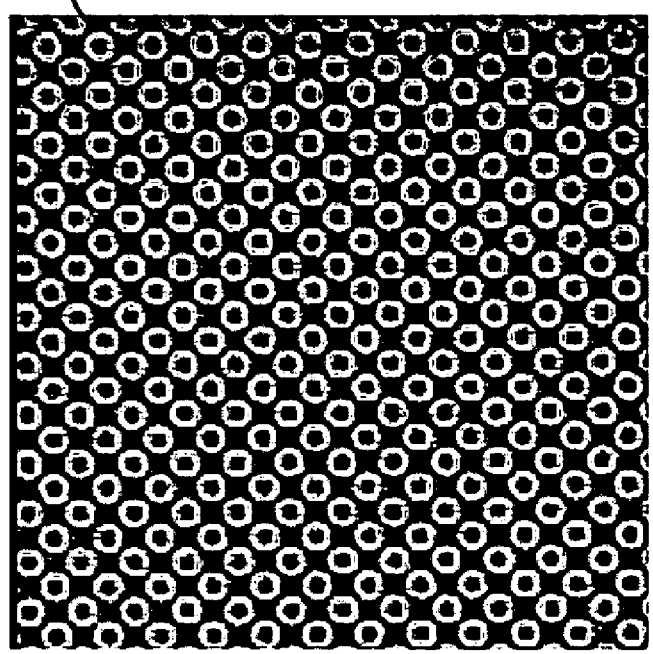
FIG. 7C shows a top view and a cross-sectional view of conventional circular lower electrodes arranged in the form of zigzag.
Figure 7C:
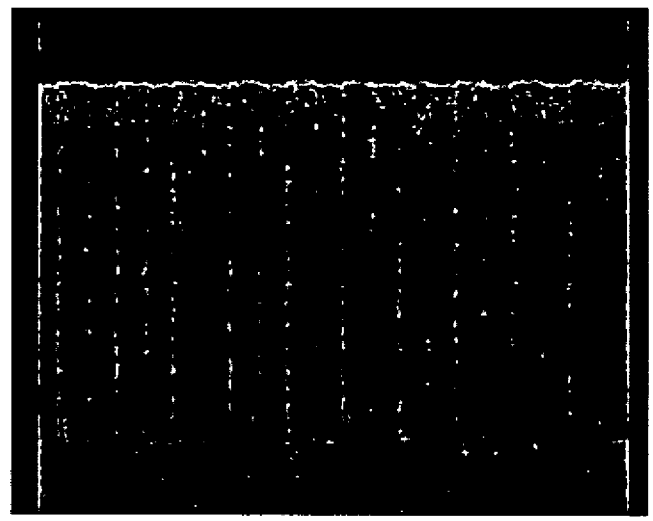
Figure 8A:
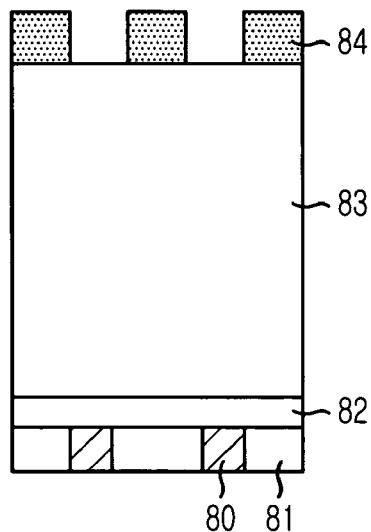
FIG. 8A shows a cross-sectional view of a conventional substrate structure prepared for forming lower electrodes.
Figure 8B:
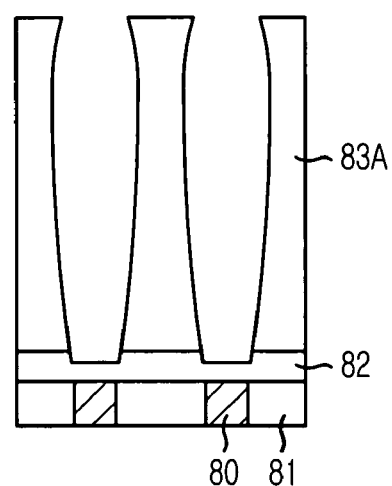
FIG. 8B shows a cross-sectional view of a conventional substrate structure obtained by performing an etching process to the substrate structure shown in FIG. 8A.
Figure 8C:
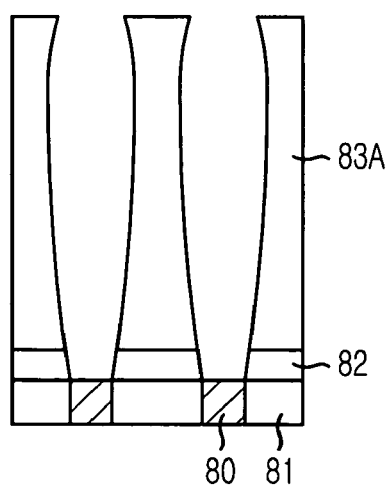
FIG. 8C shows a cross-sectional view of a conventional substrate structure obtained by performing an additional etching process to the substrate structure shown in FIG. 8B.
Figure 8D:
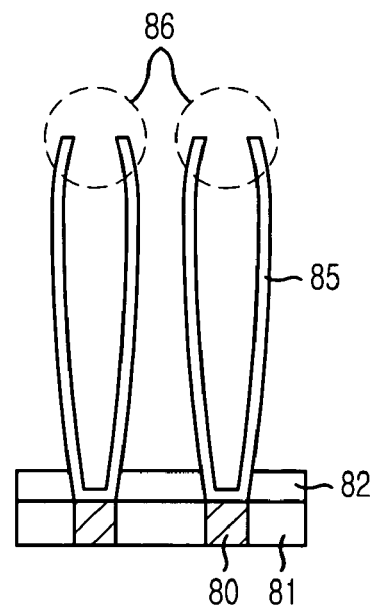
FIG. 8D shows a cross-sectional view of conventional lower electrodes formed on the substrate structure shown in FIG. 8C.
Figure 9:
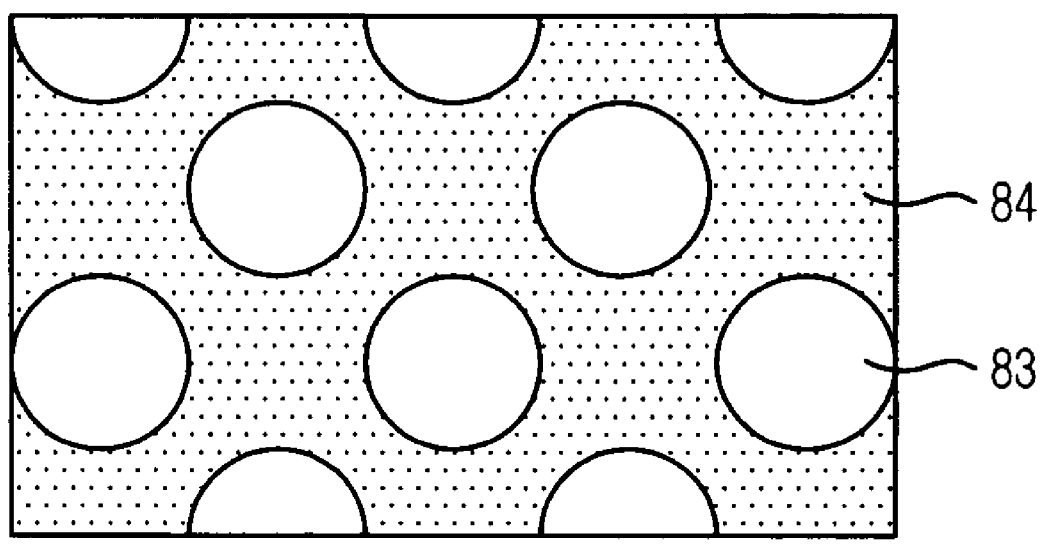
FIG. 9 is a top view of a conventional hole-type photoresist pattern used for forming a lower electrode.
Figure 10A:
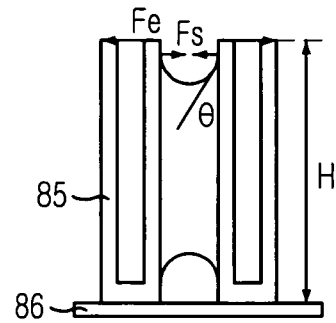
FIGS. 10A to 10C are mimetic diagrams for describing a leaning phenomenon of conventional lower electrodes formed in a cylinder structure.
Figure 10B:
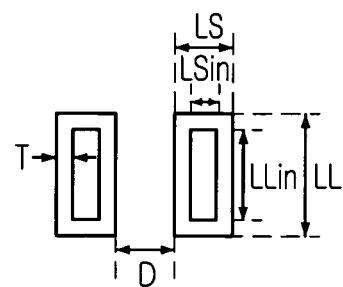
Figure 10C:
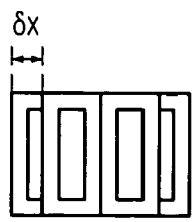
Figure 11:
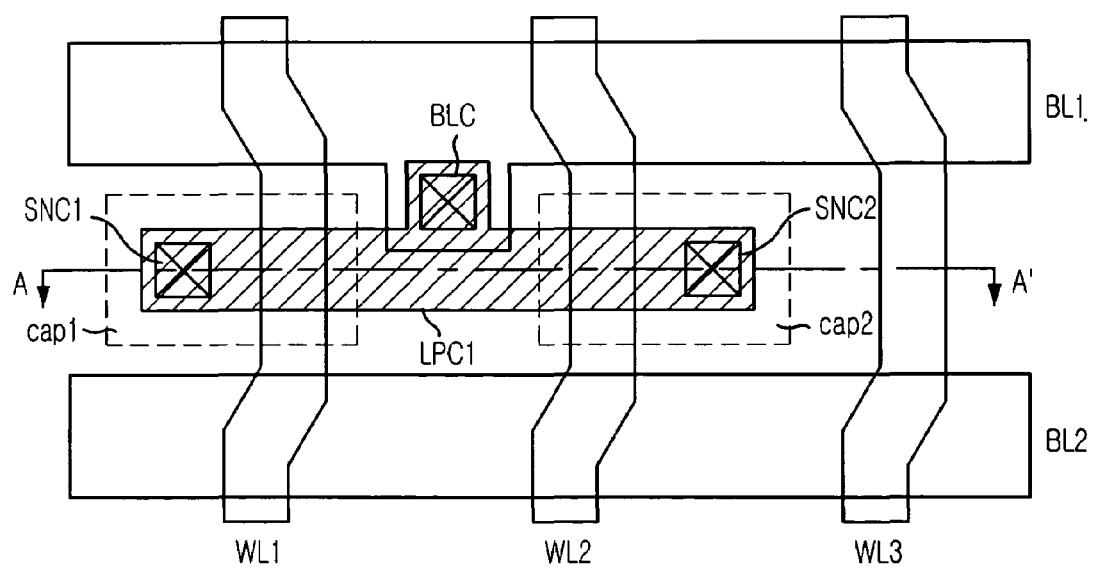
FIG. 11 is a top view showing a semiconductor memory device in accordance with a preferred embodiment of the present invention.

FIG. 11 is a top view showing a semiconductor memory device having a structure of one transistor-one capacitor (1T1C) in accordance with a preferred embodiment of the present invention.

As shown, a plurality of gate electrodes, for instance, first to third word lines WL1, WL2 and WL3, are arranged in one direction. A first bit line BL1 and a second bit line BL2 are arranged in a crossing direction to the first to the third word lines WL1 to WL3. Also, there is a landing plug contact LPC1. Herein, the landing plug contact LPC1 is made of polysilicon. Also, although not illustrated, the landing plug contact LPC1 is connected to a substrate through a contact hole formed by using a T-type mask pattern exposing a predetermined portion of the substrate, e.g., an impurity diffusion region. In a central portion of the landing plug contact LPC1, a bit line contact BLC is formed to be contacted to the first bit line BL1. Two edge portions of the landing plug contact LPC1 are electrically connected with a first capacitor Cap1 and a second capacitor Cap2 through a first storage node contact SNC1 and a second storage node contact SNC2, respectively.

FIGS. 12A to 12D are cross-sectional views taken along a line A–A' of FIG. 11 for illustrating a method for forming lower electrodes of cylindrical capacitors in accordance with the preferred embodiment of the present invention.

Figure 12A:
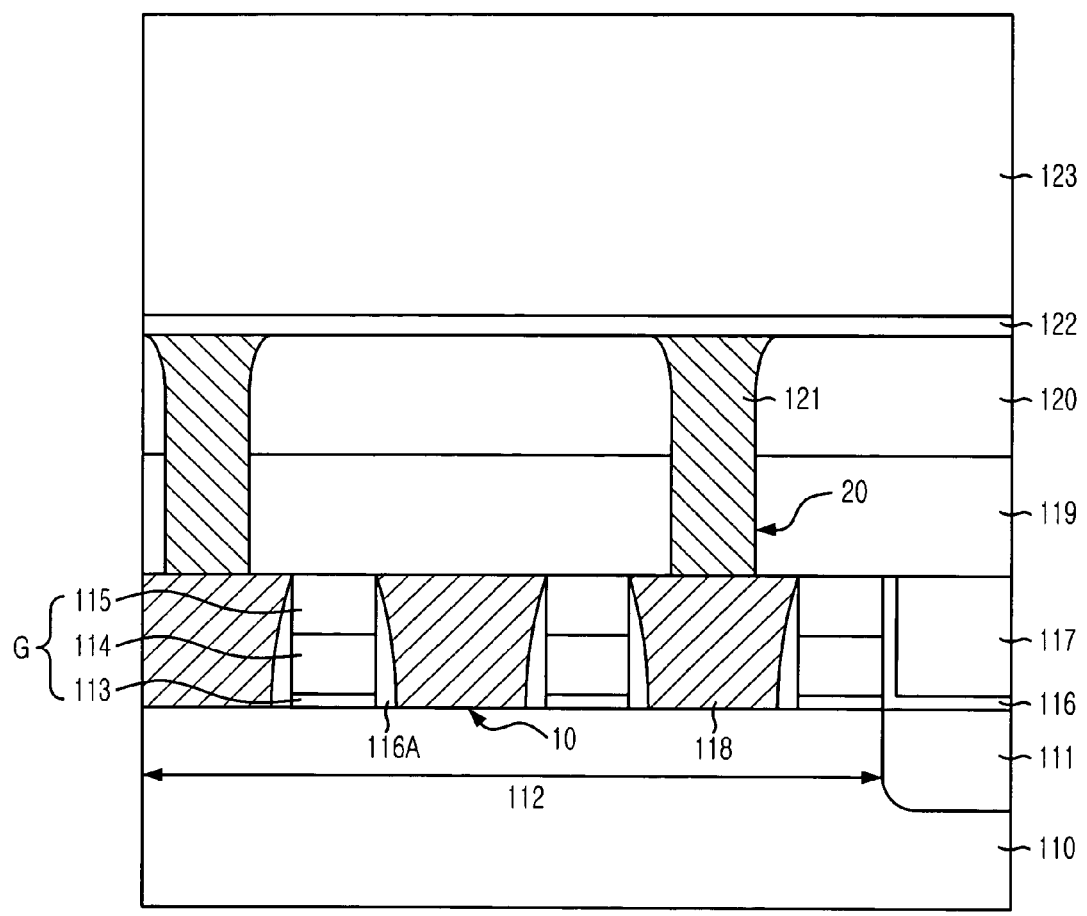
FIGS. 12A to 12D are cross-sectional views taken along a line A–A' of FIG. 11 for illustrating a method for forming lower electrodes in a cylinder structure in accordance with the preferred embodiment of the present invention.

Referring to FIG. 12A, a field insulation layer 111 is formed in a substrate 110 provided with various device elements, thereby defining a field region and an active region 112. The field insulation layer 111 is made of an oxide-based material and is formed by employing a shallow trench isolation (STI) method or a local oxidation of silicon (LOCOS) method.

Then, a plurality of gate electrode structures G are formed on the substrate 110 by performing a photolithography process with use of a mask for forming a gate electrode. Herein, each gate electrode G includes a gate insulation layer 113, a conductive layer 114 and a gate hard mask layer 115.

The first insulation layer 113 is made of an oxide-based material, and the gate conductive layer 114 is made of a material selected in single or in combination from a group consisting of polysilicon, tungsten, tungsten nitride, and tungsten silicide. The gate hard mask 115 is made of a nitride-based material such as silicon nitride or silicon oxynitride.

Such a nitride-based material for forming the gate hard mask 115 is employed to achieve effects of obtaining a vertical etch profile from a self-aligned contact (SAC) etching process for forming plugs on the basis of a difference in etch selectivity between nitride and oxide used for forming an inter-layer insulation layer and of preventing the gate electrode structures G from being damaged during the SAC etching process.

Afterwards, an etch stop layer 116 is formed with a thin thickness on the above resulting substrate structure. The etch stop layer 116 is made of a nitride-based material such as silicon nitride or silicon oxynitride having a different etch selectivity with oxide in order to prevent the gate hard mask 115 from being damaged during the SAC etching process.

Meanwhile, as a margin for a SAC etching process has been decreased in proportion to an increase in an aspect ratio, a single layer of nitride for forming the etch stop layer 116 is not capable of serving an intended role of the etch stop layer 116. Thus, in this preferred embodiment, multiple-nitride layers are used to form the etch stop layer 116.

Also, a nitride-based layer may induce a stress when the nitride-based layer makes a contact with the substrate 110 and may become a cause for increasing a parasitic capacitance since the nitride-based layer has a high dielectric constant compared with the oxide-based layer. To overcome this problem, a nitride layer and an oxide layer are stacked.

A first inter-layer insulation layer 117 made of an oxide-based material is formed on the etch stop layer 116. Herein, the first inter-layer insulation layer 117 serves a role in providing an electric isolation of the gate electrode structures G.

The first inter-layer insulation layer 117 is made of a material selected singly or in combination from a group consisting of borophosphosilicate glass (BPSG), borosilicate glass (BSG), phosphosilicate glass (PSG), tetraethylorthosilicate (TEOS), applied planarization layer (APL), spin on glass (SOG) and high density plasma (HDP) oxide.

Although not illustrated, a first photoresist pattern is formed subsequent to the formation of the first inter-layer insulation layer 117. The first photoresist pattern is prepared by performing a series of processes. First, a photoresist layer for use in a $F_2$ photolithography, or an ArF photolithography is formed on the first inter-layer insulation layer 117 by employing a spin coating method. For instance, such a material as cyclic olefin maleic anhydride (COMA) or acrylate is used as the photoresist layer for use in an ArF photolithography. Predetermined portions of the photoresist layer are then selectively photo-exposed by using a light source of ArF or $F_2$ and a predetermined reticle for defining a width of a contact plug. Afterwards, a developing process proceeds to make a photo-exposed portion or a non-photo-exposed portion remain. Etch remnants are removed by performing a cleaning process to thereby form the first photoresist pattern, which is a mask for opening a cell contact. Herein, the first photoresist pattern, which can be formed in a hole type, in a bar type, or in a T-shaped type, is formed in the T-shaped type.

Also, although not illustrated, it is possible to form an anti-reflective coating layer between the first photoresist pattern and the first inter-layer insulation layer 117 in order to prevent formation of an undesired pattern caused by a scattering reflection due to a high index of reflectance of the first inter-layer insulation layer 117 and to improve adhesiveness between the first inter-layer 117 and the first photoresist pattern. Thus, the anti-reflective coating layer is typically made of an organic material having a similar etch characteristic to the above employed photoresist layer.

A hard mask can also be formed between the first inter-layer insulation layer 117 and the photoresist layer, or between the first inter-layer insulation layer 117 and the anti-reflective coating layer. At this time, the hard mask is made of a nitride-based insulting material, or a conductive material such as tungsten or polysilicon.

Then, the first inter-layer insulation layer 117 is etched with use of the first photoresist pattern as an etch mask by performing a self-aligned contact (SAC) etching process. From this SAC etching process, a plurality of contact holes 10 are formed and portions of the etch stop layer 116 disposed between each pair of the gate electrode structures G are exposed.

At this time, the SAC etching process proceeds by employing a typical recipe for the SAC etching process. Such a fluorine-based $C_xF_y$ plasma selected from a group consisting of $C_2F_4$, $C_2F_6$, $C_3F_8$, $C_4F_6$, $C_5F_8$, and $C_5F_{10}$ is used as a main etch gas. Herein, subscripts x and y representing atomic ratios of carbon and fluorine have a value ranging from approximately 1 to approximately 10. Such a gas selected from a group consisting of $CH_2F_2$, $C_3HF_5$ and $CHF_3$ are added to produce a polymer during the SAC etching process. At this time, an inert gas such as He, Ne, Ar or Xe is used as a carrier gas.

After the SAC etching process, the exposed portions of the etch stop layer 116 is removed by using a blanket etch process to thereby expose impurity regions of the substrate 110. At this time, the etch stop layer 116 disposed at sidewalls of the gate electrode patterns G where the contact holes 10 are formed remains as a spacer 116A. The first photoresist pattern is subsequently removed by performing a photoresist stripping process.

A wet cleaning process is carried out to remove etch remnants remaining after the blanket etch process and to secure a critical dimension of each bottom part of the contact holes 10. At this time, the wet etching process uses a solution of buffered oxide etchant (BOE) or hydrofluoric acid (HF). In case that HF is used, it is preferable to use a diluted HF obtained by mixing HF with water in a ratio of approximately 1 part of HF to approximately 50 parts to approximately 500 parts of water.

Afterwards, a conductive material for forming a plug is formed on the above resulting substrate structure. Herein, polysilicon is typically used as the conductive material. It is also possible to stack polysilicon with a barrier metal of Ti or TiN. Also, such a metal as tungsten can be used as the conductive material instead of polysilicon.

A chemical mechanical polishing (CMP) process is performed under a target to expose the gate hard mask 115, so that a plurality of plugs 118 electrically connected with the impurity regions of the substrate 110 are formed.

A second inter-layer insulation layer 119 is formed on an entire surface of the above substrate structure. Although not illustrated, a second photoresist pattern for defining a bit line contact is formed. Then, the second inter-layer insulation layer 119 is selectively etched with use of the second photoresist pattern as an etch mask.

Although not illustrated, as the second inter-layer insulation layer 119 is etched, bit line contact holes exposing a group of the plugs 118 are formed. Then, bit line contact plugs are formed on the group of the exposed plugs 118. Subsequently, a conductive material for forming bit lines and an insulation layer for forming bit line hard masks are formed on the bit line contact plugs. Herein, the conductive material is selected in single, or in combination from a group consisting of tungsten, tungsten nitride, polycide and polysilicon, and the insulation layer is made of a nitride-based material. A third photoresist pattern for forming bit line structures are formed thereafter. The conductive material for forming the bit lines and the insulation layer for forming the bit line hard masks are etched to form a plurality of bit lines.

After the formation of the bit lines, another etch stop layer can be additionally formed along a profile of the bit lines to prevent the bit lines from being damaged during an etching process for forming storage node contact holes. Continuous to the formation of the bit lines, a third inter-layer insulation layer 120 is formed on the above resulting substrate structure. Herein, the second inter-layer insulation layer 119 and the third inter-layer insulation layer 120 are made of the same oxide-based material used for forming the first inter-layer insulation layer 117. Although not illustrated, a fourth photoresist pattern for forming storage node contact holes is formed thereafter.

With use of the fourth photoresist pattern as an etch mask, the third inter-layer insulation layer 120 and the second inter-layer insulation layer 119 are sequentially etched to form storage node contact holes 20 exposing a group of the plugs 118. A conductive material such as polysilicon is filled into the storage node contact holes 20 to thereby form a plurality of storage node contact plugs 121. Herein, the storage node contact plugs 121 are electrically connected with the group of the plugs 118. Another CMP process is performed to planarize the conductive material for forming the plugs 118. Herein, the storage node contact plug 121 plays a role in electrically connecting storage nodes of capacitors with the group of the plugs 118.

A second etch stop layer 122 is formed on the above resulting substrate structure in order to prevent the storage node contact plugs 121 from being damaged during an etching process for forming subsequent contact pads. Since the second etch stop layer 122 should be used as a portion of lower electrodes, the second etch stop layer 122 is made of a conductive material selected in single, or in combination from a group consisting of polysilicon, Ti, TiN, $WSi_x$, and Al.

Next, a sacrificial insulation layer 123 made of an oxide-based material is formed on the second etch stop layer 122 with a thickness that is determined by a height of a desired capacitor. Herein, the thickness of the sacrificial insulation layer 123 affects a capacitance of the capacitor.

Meanwhile, it is possible to form the above mentioned contact pads contacted to the storage node contact plugs 121.

Figure 12B:
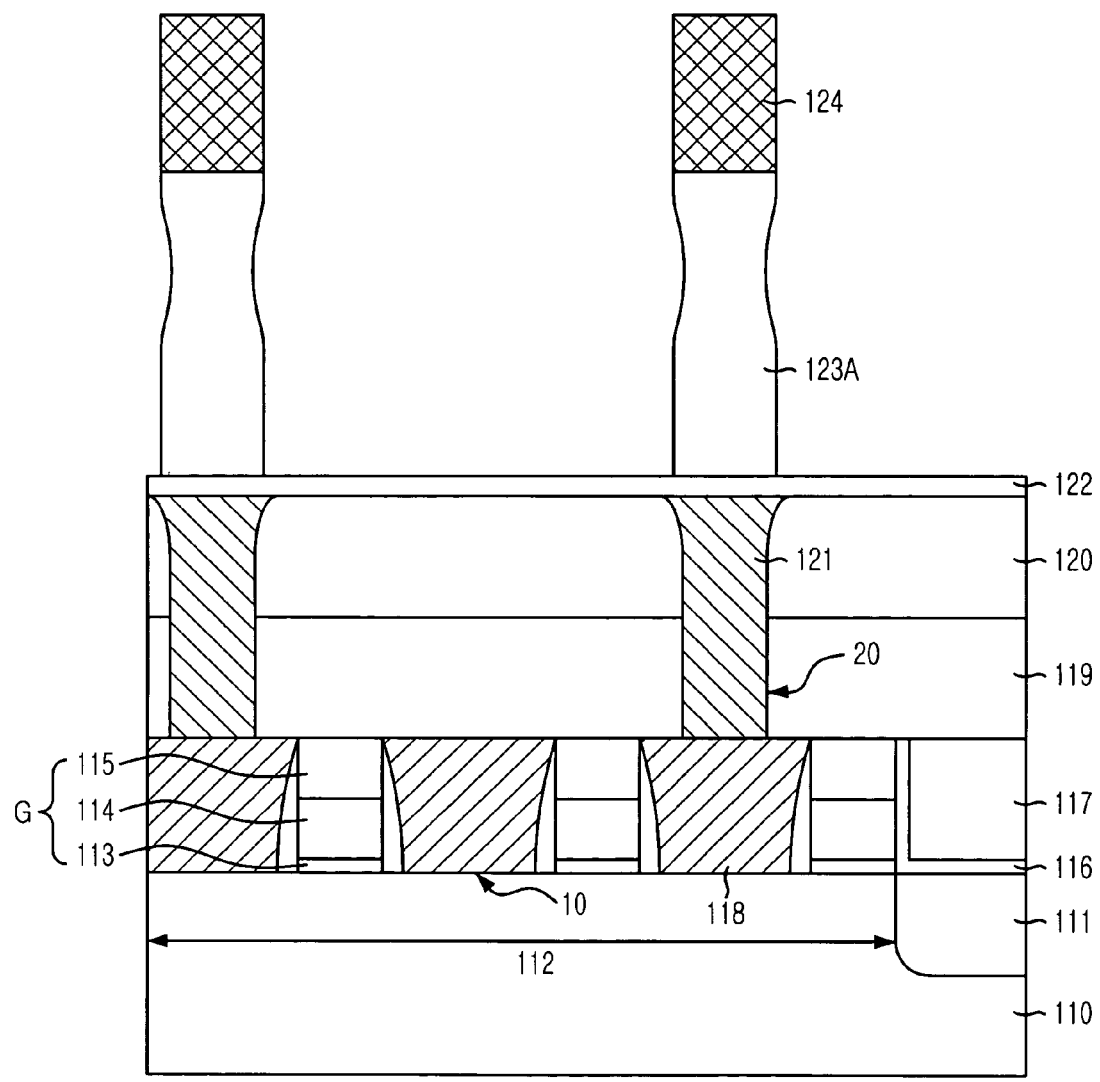

Referring to FIG. 12B, a fifth photoresist pattern 124 for forming lower electrodes is formed on the sacrificial insulation layer 123 (refer to FIG. 12A). Then, the sacrificial insulation layer 123 is etched by using the fifth photoresist pattern 124 as an etch mask. This etching process stops at the second etch stop layer 122 and provides a patterned sacrificial insulation layer 123A.

Herein, the fifth photoresist pattern 124 is formed in an island type instead of a conventional hole type, so that the fifth photoresist pattern 124 masks only the storage node contact plugs 121 in which the aforementioned lower electrodes will be formed but opens the sacrificial insulation layer 123 in the other regions.

In the meantime, an additional hard mask can be formed between the sacrificial insulation layer 123 shown in FIG. 12A and the fifth photoresist pattern 124 in order to secure a margin for a photolithography process in the course of etching the sacrificial insulation layer 123. At this time, this additional hard mask can be formed in a single layer, or in multiple layers of polysilicon, TiN, W, $WSi_x$, Ti and Al. Through controlling a thickness of this additional hard mask, it is possible to control an etch profile of the patterned sacrificial insulation layer 123A.

Figure 12C:
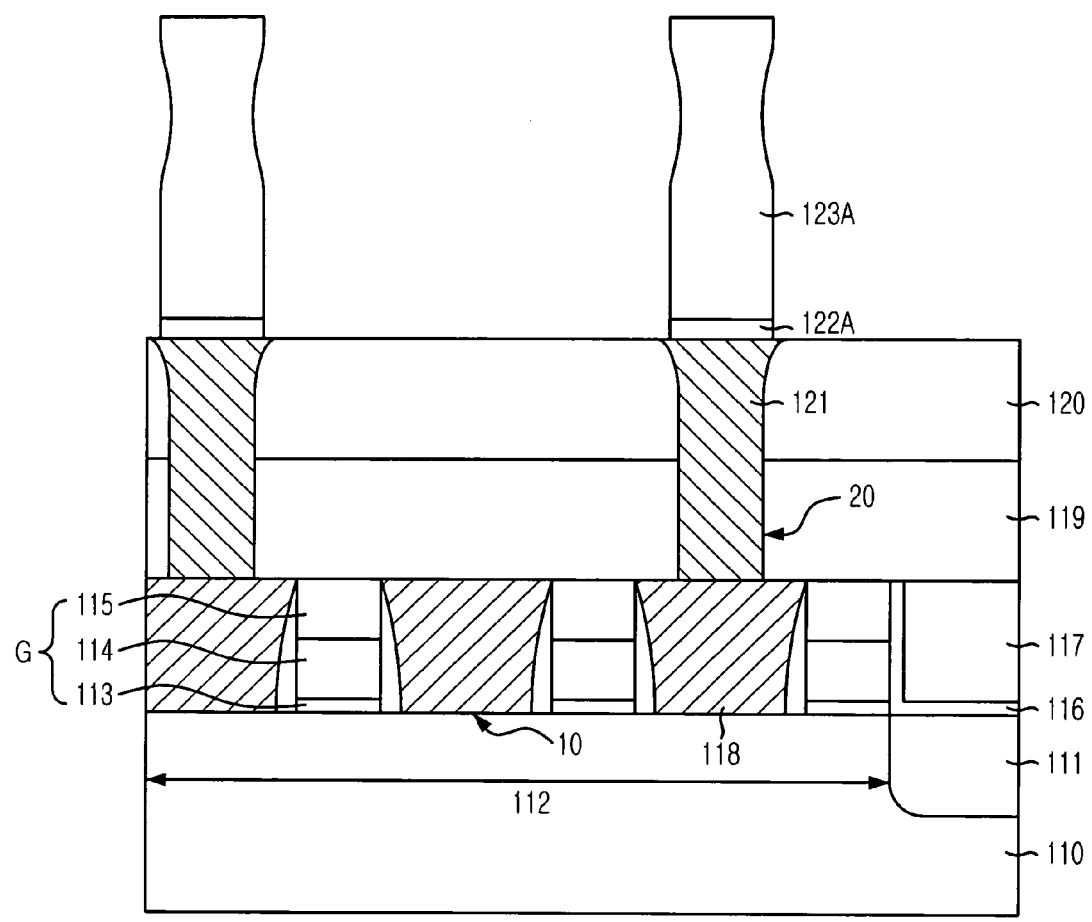

Referring to FIG. 12C, the second etch stop layer 122 is removed except for a portion in which the patterned sacrificial insulation layer 123A is formed. A reference numeral 122A denotes a remaining second etch stop layer. A photoresist stripping process is then performed to remove the fifth photoresist pattern 124.

Figure 12D:
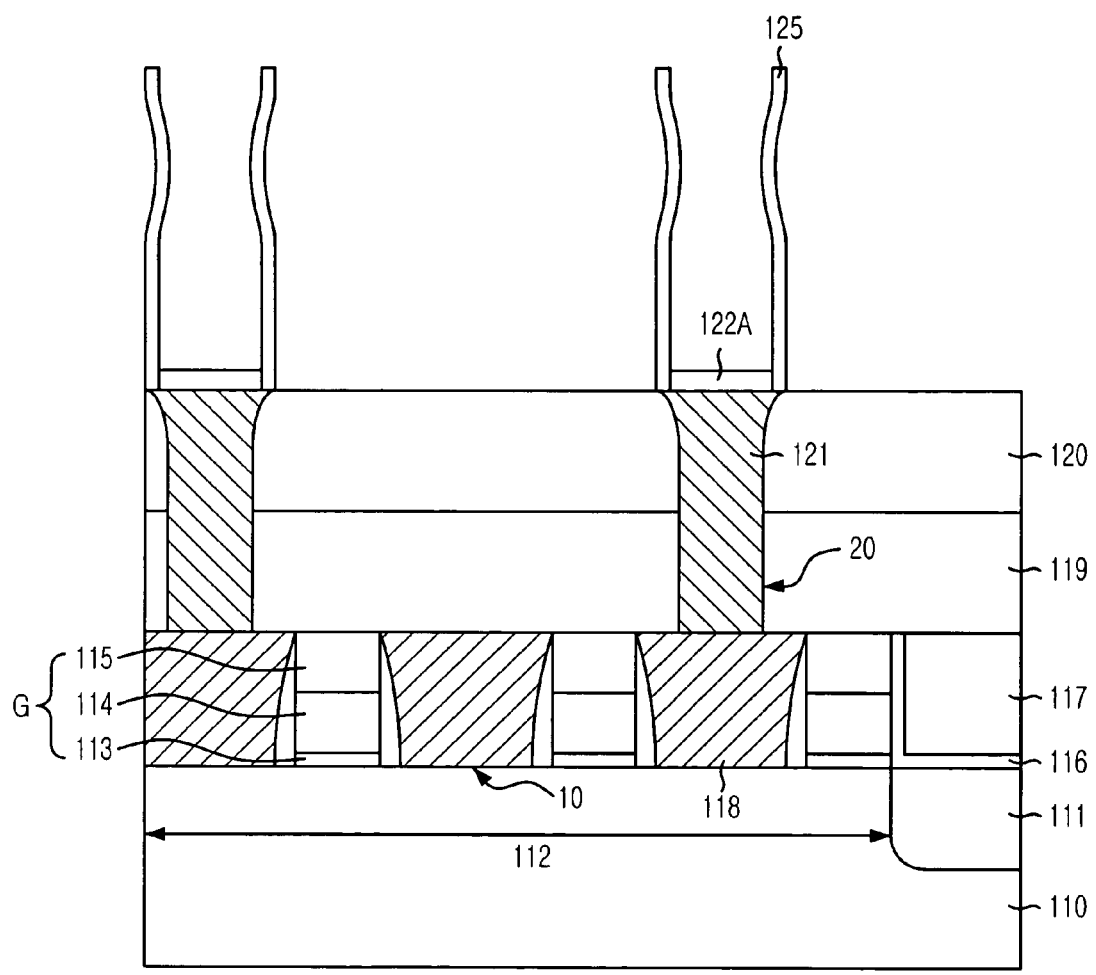

Referring to FIG. 12D, a plurality of lower electrodes 125 are formed. Although not illustrated, the lower electrodes 125 are formed through a series of processes. First, a conductive material for forming the lower electrodes 125 is formed on the patterned sacrificial insulation layer 123A shown in FIG. 12C so as to be contacted to the remaining second etch stop layer 122A which is conductive and to the storage node contact plugs 121. Afterwards, a photoresist layer is formed such that the photoresist layer fills a space created between the conductive materials formed in a concave structure. The conductive material is planarized by an etch-back process or a CMP process continuously performed until the patterned sacrificial insulation layer 123A shown in FIG. 12C is exposed. Thereafter, portions of the above conductive material disposed on the third inter-layer insulation layer 120 are removed, thereby forming the isolated lower electrodes 125.

After the formation of the lower electrodes 125, the patterned sacrificial insulation layer 123A is removed through the use of a wet dip-out process using a solution of BOE, HF, or a mixed solution of $H_2SO_4$ and $H_2O_2$. The mixed solution of $H_2SO_4$ and $H_2O_2$ is obtained by mixing $H_2SO_4$ and $H_2O_2$ in a ratio of approximately 4 to approximately 1.

Subsequently, a dry stripping process is performed on the photoresist layer by using a mixed gas of $O_2$, $CF_4$, $H_2O$ and $N_2$, or a mixed gas of $O_2$ and $N_2$. Then, a cleaning process using a solvent proceeds to remove remnants and the remaining photoresist layer.

To recover a deteriorated characteristic of the lower electrodes 125 by the above etching process, a thermal process is performed. Then, prior to forming a dielectric layer, another cleaning process using BOE is performed for a short period to additionally remove remnants.

Herein, the lower electrode 125 is made of a material selected in single, or in combination from a group consisting of Pt, Rh, Ru, Ir, Os, Pd, $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, Cu, Al, Ta, Mo, W, Au, Ag, $WSi_x$, $TiSi_x$, $MOSi_x$, $CoSi_x$, $NoSi_x$, $TaSi_x$, TiN, TaN, WN, TiSiN, TiAlN, TIBN, ZrSiN, ZrAlN, MoSiN, MoAlN, TaSiN, and TaAlN.

Although not illustrated, the above mentioned dielectric layer and an upper electrode are formed on the lower electrodes 125.

Figure 13:
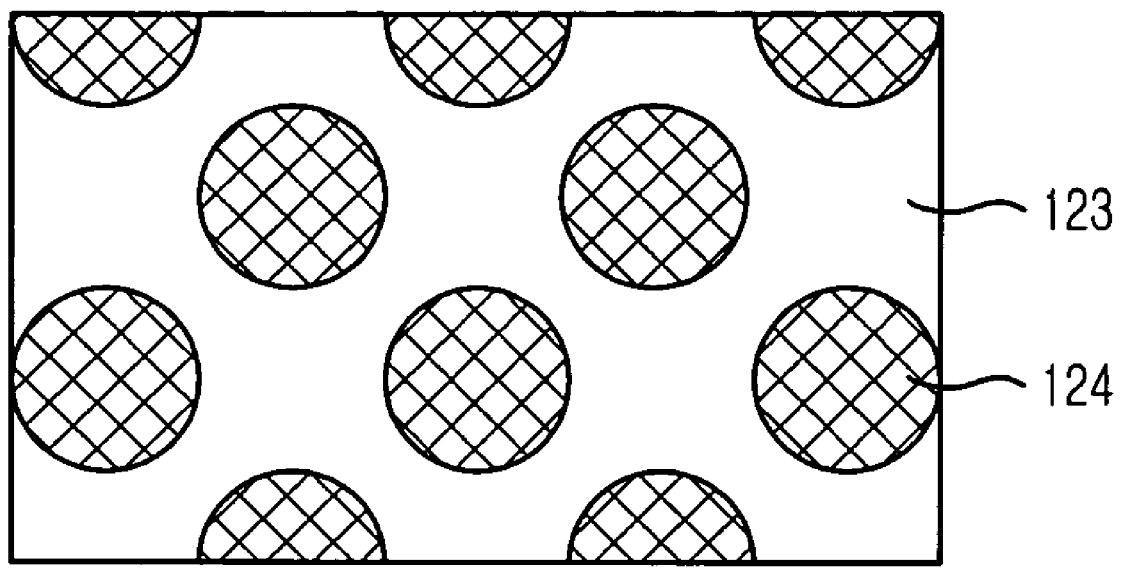
FIG. 13 is a top view of a photoresist pattern for forming a lower electrode in accordance with the preferred embodiment of the present invention.

FIG. 13 is a top view of a photoresist pattern for forming a lower electrode in accordance with the preferred embodiment of the present invention. Herein, the same reference numerals are used for the same constitution elements shown in FIGS. 12A to 12D.

As shown, a photoresist pattern 124 is formed in an island type. That is, unlike a conventional hole-type photoresist pattern connected in one part, the photoresist pattern 124 is separated for each region where a lower electrode will be formed. Therefore, in contrast to the use of the conventional hole-type photoresist pattern which removes the sacrificial insulation layer 123 on top of storage node contact plugs 121, the use of the island-type photoresist pattern 124 retains a sacrificial insulation layer 123 on the storage node contact plugs 121.

In accordance with the preferred embodiment of the present invention, the island-type photoresist pattern is used for forming the lower electrodes, and the second etch stop layer formed on the storage node contact plugs is used as a part of the lower electrodes by forming the second etch stop layer with a conductive material. Because of these specific uses of the island-type photoresist pattern and the conductive material, it is possible to prevent the lower electrodes from possessing a pot-like etch profile, which causes the lower electrodes to become leaned. Eventually, it is further possible to prevent bridge formation between the lower electrodes. This suppressed bridge formation provides an effect of preventing an incidence of electric short circuit between the lower electrodes. Also, there is another effect of increasing a capacitor capacitance. Eventually, yields and productivity of semiconductor devices can be enhanced.

The present application contains subject matter related to the Korean patent application No. KR 2003-0085647, filed in the Korean Patent Office on Nov. 28, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
   forming a plurality of plugs electrically connected to a substrate by passing through an inter-layer insulation layer;
   forming an etch stop layer on the inter-layer insulation layer and the plugs;
   forming a sacrificial layer on the substrate;
   patterning the sacrificial layer by using an island-type photoresist pattern, thereby obtaining at least one contact hole to expose portions of the inter-layer insulation layer; and
   forming a conductive layer on the sacrificial layer.

2. The method of claim 1, wherein the step of obtaining said at least one contact hole includes the steps of:
   forming the island-type photoresist pattern on the sacrificial layer;
   etching the sacrificial layer with use of the photoresist pattern as an etch mask to expose predetermined portions of the etch stop layer;
   removing the exposed portions of the etch stop layer to expose the portions of the inter-layer insulation layer; and
   removing the photoresist pattern.

3. The method of claim 2, after the step of forming the conductive layer, further including the steps of:
   planarizing the conductive layer until the sacrificial layer is exposed;
   removing the patterned sacrificial layer; and
   forming lower electrodes by removing the conductive layer disposed on the inter-layer insulation layer.

4. The method of claim 2, wherein at the step of forming the island-type photoresist pattern, the photoresist pattern is formed such that the photoresist pattern masks regions of the sacrificial layer where the lower electrodes are formed and opens the rest regions of the sacrificial layer.

5. The method of claim 4, wherein the lower electrodes is made of a material selected from a group consisting of Pt, Rh, Ru, Ir, Os, Pd, $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, Cu, Al, Ta, Mo, W, Au, Ag, $WSi_x$, $TiSi_x$, $MOSi_x$, $CoSi_x$, $NoSi_x$, $TaSi_x$, TiN, TaN, WN, TiSiN, TiAlN, TIBN, ZrSiN, ZrAlN, MoSiN, MoAlN, TaSiN, and TaAlN and the combination thereof.

6. The method of claim 3, wherein the lower electrodes are formed in a cylinder structure.

7. The method of claim 1, wherein the etch stop layer is used as a part of the lower electrode.

8. The method of claim 7, wherein the etch stop layer is made of a material selected from a group consisting of polysilicon, Ti, TiN, $WSi_x$ and Al.

9. The method of claim 7, wherein the etch stop layer is made of a material selected in combination from a group consisting of polysilicon, Ti, TiN, $WSi_x$ and Al.

10. The method of claim 1, wherein at the step of etching the sacrificial layer, the predetermined portions of the etch stop layer corresponds to regions except for regions where the lower electrodes are formed.

11. The method of claim 1, further including the step of forming a layer for use in a hard mask after the step of forming the sacrificial layer and the step of etching the layer for use in the hard mask by using the island-type photoresist pattern as an etch mask after the step of forming the island-type photoresist pattern.

12. The method of claim 1, wherein the sacrificial layer is made of an oxide-based material.

13. A method for fabricating a semiconductor device, comprising the steps of:

forming a plurality of plugs electrically connected to a substrate by passing through an inter-layer insulation layer;

forming a conductive etch stop layer on the inter-layer insulation layer and the plugs;

forming a sacrificial insulation layer on the etch stop layer;

forming an island-type photoresist pattern on the layer;

etching the sacrificial insulation layer with use of the photoresist pattern as an etch mask to expose predetermined portions of the etch stop layer;

removing the exposed portions of the etch stop layer to expose portions of the inter-layer insulation layer;

removing the photoresist pattern;

forming a conductive layer on the sacrificial insulation layer and a remaining portion of the etch stop layer;

planarizing the conductive layer until the sacrificial insulation layer is exposed;

removing the sacrificial insulation layer; and forming lower electrodes by removing the conductive layer disposed on the inter-layer insulation layer.

* * * * *

UNITED STATES PATENT AND TRADEMARK OFFICE
CERTIFICATE OF CORRECTION

PATENT NO. : 7,029,970 B2 Page 1 of 1
APPLICATION NO. : 10/931770
DATED : April 18, 2006
INVENTOR(S) : Ahn It is certified that error appears in the above-identified patent and that said Letters Patent is hereby corrected as shown below:

In Claim 13, Column 18, line 8, after "on the" please insert -- sacrificial insulation --.

Signed and Sealed this

Thirty-first Day of July, 2007

JON W. DUDAS
*Director of the United States Patent and Trademark Office*